(12) United States Patent
Nakata

(10) Patent No.: US 11,430,726 B2
(45) Date of Patent: Aug. 30, 2022

(54) SEMICONDUCTOR MODULE

(71) Applicant: Mitsubishi Electric Corporation, Tokyo (JP)

(72) Inventor: Yosuke Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 137 days.

(21) Appl. No.: 16/954,192

(22) PCT Filed: Apr. 18, 2018

(86) PCT No.: PCT/JP2018/016022
§ 371 (c)(1),
(2) Date: Jun. 15, 2020

(87) PCT Pub. No.: WO2019/202687
PCT Pub. Date: Oct. 24, 2019

(65) Prior Publication Data
US 2021/0167005 A1 Jun. 3, 2021

(51) Int. Cl.
*H01L 23/498* (2006.01)
*H01L 23/31* (2006.01)
(Continued)

(52) U.S. Cl.
CPC .... *H01L 23/49844* (2013.01); *H01L 23/3121* (2013.01); *H01L 23/492* (2013.01);
(Continued)

(58) Field of Classification Search
CPC ........... H01L 23/49844; H01L 23/3121; H01L 23/492; H01L 23/49811; H01L 23/48
See application file for complete search history.

(56) References Cited

U.S. PATENT DOCUMENTS

2003/0094679 A1 5/2003 Asano et al.
2013/0306991 A1 11/2013 Terai et al.
(Continued)

FOREIGN PATENT DOCUMENTS

JP H09129810 A 5/1997
JP 2001284395 A 10/2001
(Continued)

OTHER PUBLICATIONS

An Office Action; "Notice of Reasons for Refusal," mailed by the Japanese Patent Office dated Mar. 2, 2021, which corresponds to Japanese Patent Application No. 2020-514848 and is related to U.S. Appl. No. 16/954,192 with English language translation.
(Continued)

*Primary Examiner* — Jasmine J Clark
(74) *Attorney, Agent, or Firm* — Studebaker & Brackett PC

(57) ABSTRACT

A semiconductor device (4a-4d) and a wiring device (5) are provided on a main surface of a base plate (1). A first wire (11a-11e) connects an external electrode (7a-7e) and a first relay pad (8a-8e) of the wiring device (5). A second wire (12a-12e) connects a pad (13a-13e) of the semiconductor device (4a-4d) and the second relay pad (9a-9e) of the wiring device (5). Resin (15) seals the semiconductor device (4a-4d), the wiring device (5) and the first and second wires (11a-11e,12a-12e). The second wire (12a-12e) is thinner than the first wire (11a-11e). The pad (13a-13e) is smaller than the first relay pad (8a-8e).

18 Claims, 4 Drawing Sheets

(51) Int. Cl.
*H01L 23/492* (2006.01)
*H01L 23/00* (2006.01)

(52) U.S. Cl.
CPC ........ *H01L 23/49811* (2013.01); *H01L 24/48* (2013.01); *H01L 2224/48157* (2013.01); *H01L 2224/48599* (2013.01)

(56) References Cited

U.S. PATENT DOCUMENTS

| | | | |
|---|---|---|---|
| 2015/0035138 A1 | 2/2015 | Miyamoto et al. | |
| 2015/0287665 A1 | 10/2015 | Hanada | |
| 2017/0018533 A1 | 1/2017 | Miki | |
| 2017/0330810 A1* | 11/2017 | Joko | H01L 23/293 |
| 2019/0097563 A1 | 3/2019 | Shimomugi et al. | |

FOREIGN PATENT DOCUMENTS

| | | | | |
|---|---|---|---|---|
| JP | 2003204009 A | | 7/2003 | |
| JP | 2004039807 A | * | 2/2004 | ... H01L 2224/48139 |
| JP | 2006041098 A | | 2/2006 | |
| JP | 2008211237 A | | 9/2008 | |
| JP | 2016162913 A | | 9/2016 | |
| JP | 2017022301 A | | 1/2017 | |
| WO | 2010084550 A1 | | 7/2010 | |
| WO | 2012144070 A1 | | 10/2012 | |
| WO | 2014006724 A1 | | 1/2014 | |
| WO | 2014046058 A1 | | 3/2014 | |
| WO | 2017037942 A1 | | 3/2017 | |

OTHER PUBLICATIONS

International Search Report; Written Opinion; and Notification of Transmittal of The International Search Report and the Written Opinion of the International Searching Authority, or the Declaration issued in PCT/JP2018/016022; dated Jun. 26, 2018.

\* cited by examiner

SEMICONDUCTOR MODULE

FIELD

The present disclosure relates to a semiconductor module.

BACKGROUND

A semiconductor module is used that includes a plurality of semiconductor devices each having pads to which respective wires are bonded, the plurality of semiconductor devices being configured to be driven in parallel (e.g., see PTL 1).

CITATION LIST

Patent Literature

PTL 1: WO2014/046058

SUMMARY

Technical Problem

In semiconductor modules sealed with epoxy resin or the like, the resin inflow may cause a wire to be displaced. Therefore, it is difficult to make wires finer in order to secure manufacturability and reliability. However, when the wire is thick, the size of the pad of a semiconductor device to which the wire is to be bonded also needs to be increased, resulting in a problem that an effective area of the semiconductor device is reduced.

The present invention has been implemented to solve the aforementioned problem, and it is an object of the present invention to provide a semiconductor module capable of increasing the effective area of the semiconductor device while securing manufacturability and reliability.

Solution to Problem

A semiconductor module according to the present disclosure includes: a base plate; a semiconductor device provided on the base plate and having a pad; an external electrode; a wiring device provided on the base plate and including a first relay pad, a second relay pad provided closer to the pad than the first relay pad, and wiring connecting the first relay pad and the second relay pad; a first wire connecting the external electrode and the first relay pad; a second wire connecting the pad and the second relay pad; and resin sealing the semiconductor device, the wiring device and the first and second wires, wherein the second wire is thinner than the first wire, and the pad is smaller than the first relay pad.

Advantageous Effects of Invention

In the present disclosure, it is possible to shorten the distance between the pads of the semiconductor devices and the relay pads of the wiring device using the wiring device, and therefore even when the wires connecting both pads are made thinner, wire strength can be secured. Furthermore, the pads of the semiconductor devices for bonding the fine wires can be reduced in size. Thus, the effective areas of the semiconductor devices can be increased while securing manufacturability and reliability.

DESCRIPTION OF EMBODIMENTS

A semiconductor module according to the embodiments of the present disclosure will be described with reference to the drawings. The same components will be denoted by the same symbols, and the repeated description thereof may be omitted.

First Embodiment

Figure 1:
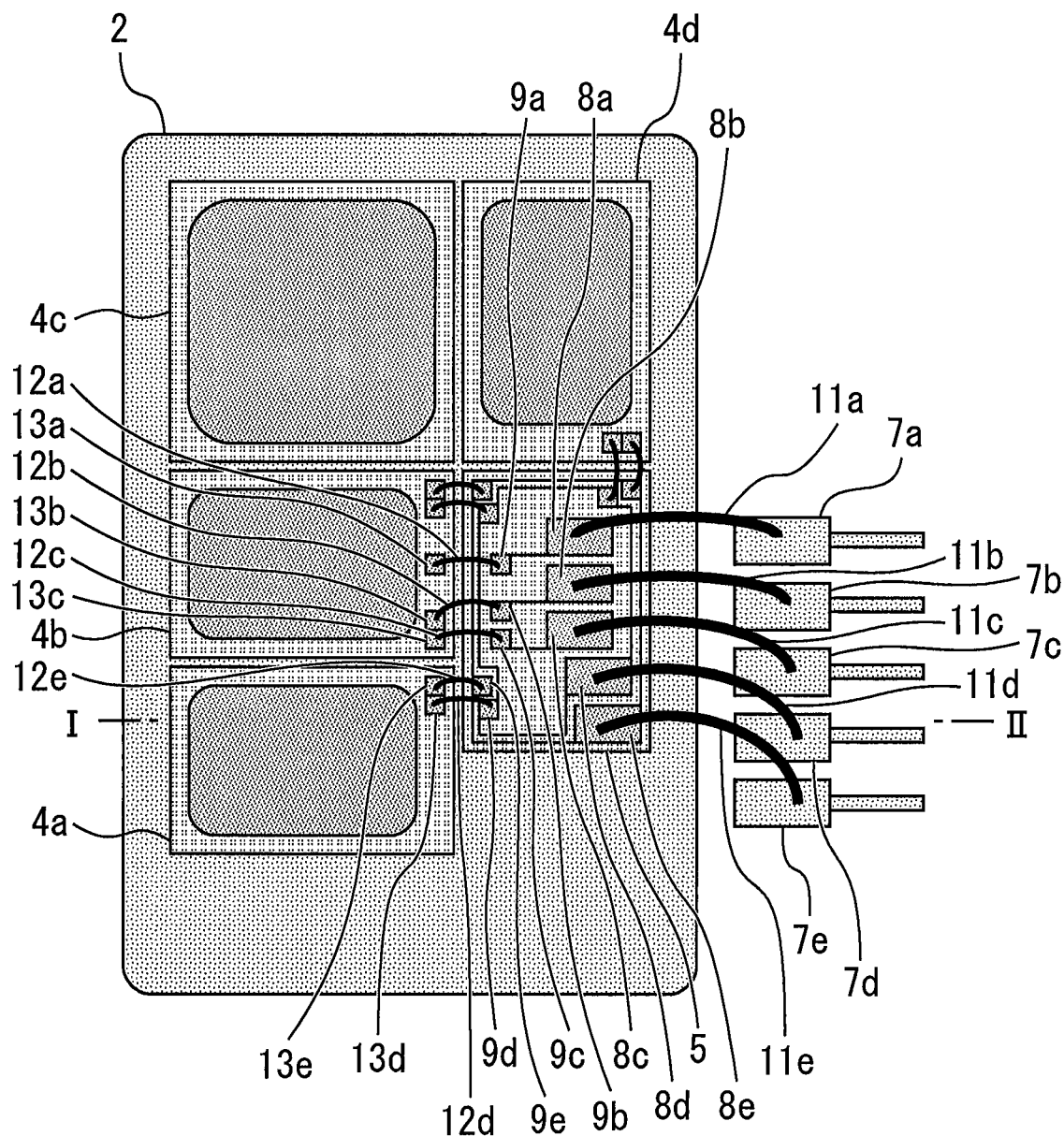
FIG. 1 is a plan view illustrating a semiconductor module according to a first embodiment.
Figure 2:
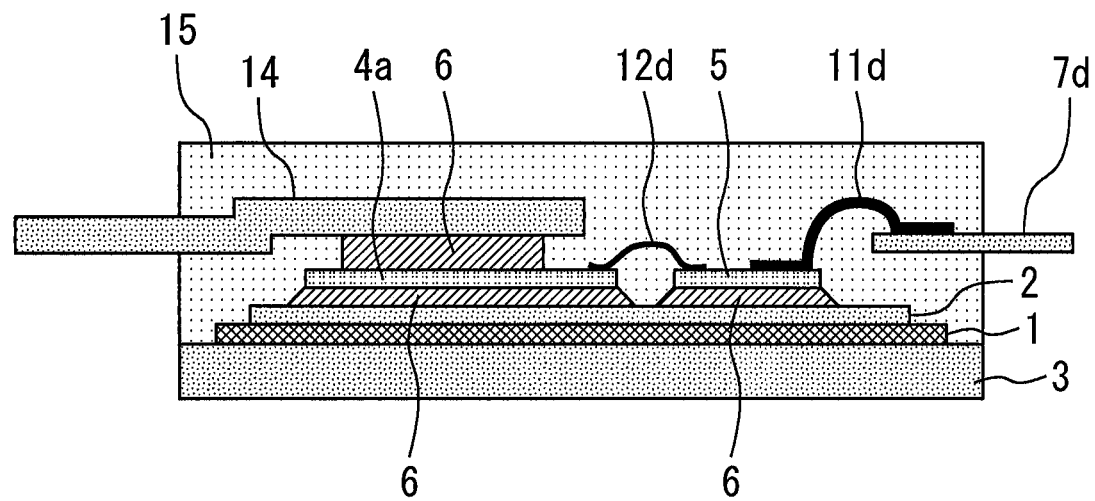
FIG. 2 is a cross-sectional view along I-II in FIG. 1.
Figure 3:
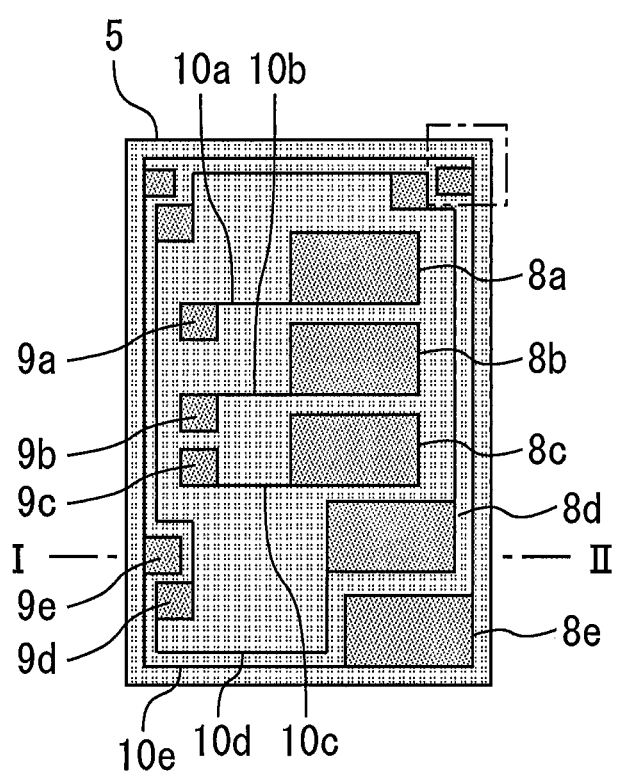
FIG. 3 is a plan view illustrating wiring devices according to the first embodiment.

FIG. 1 is a plan view illustrating a semiconductor module according to a first embodiment. FIG. 2 is a cross-sectional view along I-II in FIG. 1. FIG. 3 is a plan view illustrating wiring devices according to the first embodiment.

An electrode substrate is constructed with a circuit pattern 2 formed on a top surface of an insulating substrate 1, which is a base plate. A metal layer 3 for connection with a cooling device via grease or solder is formed on an undersurface of the insulating substrate 1. The metal layer 3 is not limited to a flat one but a pin-fin shaped or blade shaped directly coolable part may be formed.

Semiconductor devices 4a to 4d and a wiring device 5 are provided on the circuit pattern 2 located on the same plane, and are bonded with a joining material 6 such as solder. Metal films to be solder-bonded to the circuit pattern 2 are formed on reverse sides of the semiconductor devices 4a to 4d and the wiring device 5. The metal films are made mainly of, for example, nickel. External electrodes 7a to 7e are provided near the wiring device 5.

The semiconductor devices 4a to 4d are MOSFETs. Without being limited to this, however, the semiconductor devices 4a to 4d may be any energizable devices such as IGBTs, which are likewise switching devices, or SBDs, which are freewheeling devices. As the freewheeling devices, body diodes of MOSFETs may also be used instead of SBDs. In all cases, these devices are adjusted to thicknesses necessary and sufficient for maintaining a withstand voltage or the like using a method such as grinding to reduce conduction losses. On the other hand, no device such as transistor or diode is formed on the wiring device 5.

Relay pads 8a to 8e are provided near the external electrodes 7a to 7e on the top surface of the wiring device 5. Relay pads 9a to 9e are provided closer to pads 13a to 13e of the semiconductor devices 4a to 4d than the relay pads 8a to 8e. Wiring 10a to 10e connect the relay pads 8a to 8e and the relay pads 9a to 9e respectively. Wires 11a to 11e connect the external electrodes 7a to 7e and the relay pads 8a to 8e respectively. Wires 12a to 12e connect the pads 13a to 13e of the semiconductor devices 4a to 4d and the relay pads 9a to 9e respectively.

A plate-shaped conductor 14 is bonded to a source electrode, which is a surface electrode of the plurality of semiconductor devices 4a to 4d via the joining material 6 such as solder. Metal films made mainly of, for example, nickel are formed on the surface electrodes of the plurality of semiconductor devices 4a to 4d for solder bonding. Note that in order to prevent interference between the plate-shaped conductor 14 and a wire bonding tool, the plate-shaped conductor 14 needs to be bonded after wire bonding between the semiconductor devices 4a to 4d and the wiring device 5.

In order to insulate the devices and electrodes from outside air, resin 15 seals the semiconductor devices 4a to 4d, the wiring device 5 and the wires 11a to 11e, and 12a to 12e. The resin 15 is formed, for example, by injecting epoxy resin into a resin case and curing it or press-fitting transfer mold resin into a metal die and curing it. Using the resin 15 can improve moisture resistance, vibration resistance and reliability with respect to a cooling/heating cycle.

Here, the external electrodes 7a to 7e are fixed with a case or lead frame, and are provided outside the package. Therefore, the wiring device 5 is separated from the external electrodes 7a to 7e. The wires 11a to 11e for connecting the external electrodes 7a to 7e are long and have higher loop heights. Therefore, the wires 11a to 11e need to be thick to have enough rigidity not to be displaced by the resin 15. The wires 11a to 11e are, for example, aluminum wires having a diameter of 200 μm. Using low-cost aluminum as the main material of the wires 11a to 11e can suppress rising material costs even when the wire diameter is increased. Furthermore, it is possible to use a conventional wire bonding apparatus, and so it is easier to coexist with existing manufacturing facilities.

The wires 12a to 12e are, for example, gold wires having a diameter of 30 μm. Using gold as the main material of the wires 12a to 12e can suppress deterioration in durability due to connection failures and oxidation even when the wires are made thinner. Note that although the material cost of gold is high, lengths of the wires 12a to 12e are reduced, it is therefore possible to suppress cost increases. In this way, the wires 12a to 12e are thinner than the wires 11a to 11e. However, the wire diameter is merely an example, and the wire diameter needs to be adjusted as appropriate according to wiring lengths, viscosity, flow rate, inflow direction or the like of the sealing resin to be injected. The pads 13a to 13e and the relay pads 9a to 9e of the semiconductor devices 4a to 4d to which the fine wires 12a to 12e are bonded are smaller than the relay pads 8a to 8e to which thick wires 11a to 11e are bonded.

Figure 4:
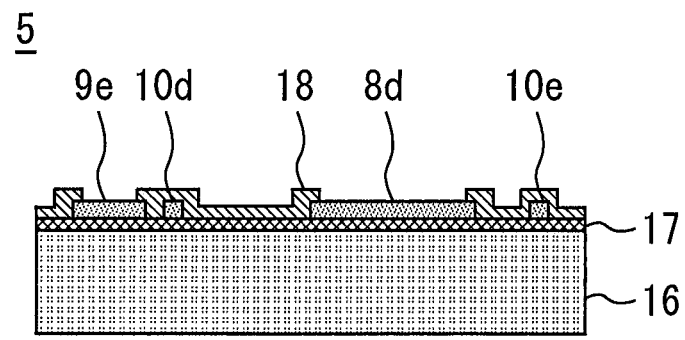
FIG. 4 is a cross-sectional view along I-II in FIG. 3.

FIG. 4 is a cross-sectional view along I-II in FIG. 3. An insulating layer 17 is formed on a substrate 16. The relay pads 8a to 8e, 9a to 9e and the wiring 10a to 10e are formed on the insulating layer 17. The plurality of wiring 10a to 10e are covered with a coating film 18. It is thereby possible to secure insulating properties even when a wire-to-wire distance is reduced. Therefore, since the size of the wiring device 5 can be reduced, it is possible to further reduce manufacturing costs and reduce the size of the semiconductor module. The coating film 18 is made mainly of polyimide. This enables manufacturing with low cost and high stability that utilizes conventional wafer processes and secures manufacturing costs and reliability. Moreover, polyimide also has good compatibility with an epoxy resin sealing member.

Figure 5:
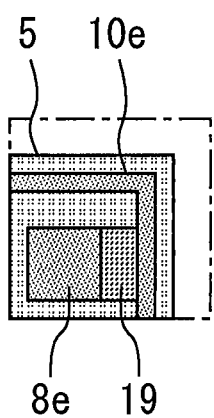
FIG. 5 is an enlarged plan view of a region enclosed by a broken line in FIG. 3.

FIG. 5 is an enlarged plan view of a region enclosed by a broken line in FIG. 3. A plurality of relay pads 8e are connected to the gates of the plurality of semiconductor devices 4a to 4d respectively. The wiring 10e is connected to the plurality of relay pads 8e respectively. A plurality of gate resistors 19 are connected between the plurality of relay pads 8e and the wiring 10e respectively. Even when a threshold voltage of the semiconductor devices 4a to 4d is shifted from a target value due to a variation in the wafer processes of the semiconductor devices 4a to 4d, the shift of the threshold voltage can be canceled out by adjusting the resistance value of the gate resistors 19. More specifically, the higher the threshold voltage of the corresponding semiconductor devices 4a to 4d is, the lower resistance value is set for the gate resistors 19. This makes it possible, in the semiconductor module having semiconductor devices to be subjected to ranked selection based on the threshold voltage, to cancel a variation in the threshold voltage of the plurality of semiconductor devices and uniformly drive the plurality of semiconductor devices 4a to 4d. As a result, current unbalance will not occur when the plurality of semiconductor devices 4a to 4d are driven in parallel and it is possible to equalize switching characteristics for each semiconductor module subjected to ranked selection as much as possible.

The gate resistor 19 is a polysilicon resistor film made mainly of silicon. For example, after uniformly depositing a polysilicon film, a gate resistor polysilicon film is formed by patterning the polysilicon film into an arbitrary shape through photoengraving processing and etching processing. In this way, since the polysilicon resistor film can be formed on the same chip in a conventional wafer process, it is possible to easily realize a homogeneous gate resistor. For example, a photolithography mask is switched, the size of the silicon film for the gate resistor 19 is changed and the resistance value of the gate resistor 19 is adjusted. Alternatively, it is possible to adjust the resistance value of the gate resistor 19 by adjusting impurity concentration of the silicon film for the gate resistor 19 or trimming the silicon film for the gate resistor 19 via a laser beam or the like.

In the present embodiment, it is possible to shorten the distance between the pads 13a to 13e of the semiconductor devices 4a to 4d and the relay pads 9a to 9e of the wiring device 5 using the wiring device 5, and therefore even when the wires 12a to 12e connecting both pads are made thinner, wire strength can be secured. Furthermore, the pads 13a to 13e of the semiconductor devices 4a to 4d for bonding the fine wires 12a to 12e can be reduced in size. Thus, the effective areas of the semiconductor devices 4a to 4d can be increased while securing manufacturability and reliability. It is possible to achieve high output and low cost by increasing the effective areas of the semiconductor devices 4a to 4d.

The circuit pattern 2 on the insulating substrate 1 is a strong electricity part which is connected to a drain (power terminal) on the undersurfaces of the semiconductor devices 4a to 4d and to which a high voltage is applied. The substrate 16 of the wiring device 5 is formed on the strong electricity part. The insulating layer 17 such as a thermal oxide film is formed on the substrate 16, and the relay pads 8a to 8e, 9a to 9e and the wiring 10a to 10e are formed thereon. The insulating layer 17 can secure insulation between the strong electricity part and the wiring 10a to 10e or the like and thereby improve reliability. Note that conventionally, the strong electricity part and the signal wiring have been formed on a ceramic substrate, and so the wire-to-wire distance has to be widened to secure the insulating distance between both parts. By contrast, since the present embodiment realizes insulation from the strong electricity part using a longitudinal structure of the wiring device 5, the wire-to-wire distance on the top surface of the substrate 16 can only be a distance necessary for insulation on the order of a control supply voltage. This makes it possible to increase the degree of freedom of wiring layout and connect wires at a shortest distance.

The wiring 10e connected to the gates of the semiconductor devices 4a to 4d and the wiring 10d connected to the source are provided in a ring shape. The other wiring 10a to 10c are provided inside thereof. This can miniaturize the wiring device 5. The distances among the wires 12a to 12e in connections with the semiconductor devices 4a to 4d having no sense devices can be made shortest possible, and the manufacturing yield can be thereby improved. Note that in response to a change in the main current, an electromotive force may be generated in the loop of the ring-shaped wiring 10d and 10e, which may cause an induced current to flow and cause the semiconductor devices 4a to 4d to malfunction. Thus, part of the ring-shaped wiring 10d and 10e may be opened. This makes it possible to avoid a loop from being formed and minimize induction from the main current.

Using the plate-shaped conductor 14 can reduce wiring resistance and inductance compared to wire bonding. Since the pads 13a to 13e can be reduced in size in the present embodiment, it is possible to increase the bonding area with the plate-shaped conductor 14 and reduce wiring resistance and inductance.

Reducing the size of the wiring device 5 gives spare space for locating the plurality of semiconductor devices 4a to 4d, increases the degree of freedom of layout design and thereby allows the plurality of semiconductor devices 4a to 4d to be provided adjacent to each other. As a result, it is possible to reduce the size of the plate-shaped conductor 14 connected to the plurality of semiconductor devices 4a to 4d. It is thereby possible to reduce material processing cost and material cost of the plate-shaped conductor 14 and at the same time reduce losses of the semiconductor devices 4a to 4d by the effect of reducing inductance or the like. Furthermore, it is also possible to reduce stress caused by a difference in coefficient of linear expansion between the plate-shaped conductor 14 and peripheral members of the semiconductor devices 4a to 4d, and improve reliability. Furthermore, the plate-shaped conductor 14 may cover the wiring device 5. It is thereby possible to simplify wiring of the main current circuit, reduce the size of the semiconductor module and improve manufacturing cost, electric characteristics and reliability.

The loop height can be reduced by making the wires 12a to 12e thinner. Therefore, even when the plate-shaped conductor 14 covers the joint between the semiconductor devices 4a to 4d and the wires 12a to 12e, it is possible to minimize the clearance between the wires 12a to 12e and the plate-shaped conductor 14. Therefore, it is possible to avoid short-circuits between the wires 12a to 12e and the plate-shaped conductor 14 without extremely increasing the thickness of the semiconductor module.

The semiconductor device 4b includes a sense device. The sense device allows the state of the semiconductor device 4b to be grasped accurately and successively. In this way, a protective circuit can be operated at the right time and it is possible to reduce loss of the semiconductor module and improve reliability.

The sense device includes a temperature sense diode that detects temperature of the semiconductor devices and a current sense device that detects a current value flowing through the semiconductor device at a constant flow dividing ratio. The pad 13a of the semiconductor device 4b is connected to the current sense device, and the pads 13b and 13c are connected to the anode and the cathode of the temperature sense diodes respectively. Note that shorting out the pad 13c connected to the cathode and the pad 13d connected to the source can reduce the number of pads.

When the plurality of semiconductor devices 4a to 4d are provided densely to reduce the size of the semiconductor module, the temperature of the semiconductor device provided inside the insulating substrate 1 is likely to rise. For this reason, it is preferable to locate the semiconductor device 4b including the sense device inside the insulating substrate 1 compared with the semiconductor devices 4a, 4c and 4d including no sense device.

The semiconductor devices 4a to 4d include compound semiconductor substrates such as silicon carbide or gallium nitride. Since compound semiconductors involve high material costs and processing costs, the product cost can be reduced by increasing the effective areas of the semiconductor devices according to the present embodiment.

When the wiring device 5 includes a silicon substrate, the silicon substrate can be easily formed using existing wafer processes and can be assembled using the same technique as that for the semiconductor devices 4a to 4d. Thus, the manufacturing cost can be reduced. Moreover, using a photoengraving process can form complicated fine wires, and thus can miniaturize the wiring device 5. This makes it possible to reduce the main current wiring length and reduce inductance of the main current wiring and thereby reduce switching losses when driving a semiconductor device made of SiC, etc. Furthermore, it is possible to locate the wiring in the wiring device 5, particularly the wiring 10e connected to the gate and the wiring 10d connected to the source placed as close as possible. For this reason, it is possible to minimize induction from the main current and prevent malfunction of the semiconductor devices 4a to 4d. Complicated wiring is formed for the wiring device 5 having wires other than the wiring 10d and 10e in particular, but the wiring loop between the wiring 10d and 10e can be easily minimized. It is possible to realize equal length wiring for a plurality of semiconductor devices by annularly wiring the wiring 10d and 10e provided close to each other.

The substrate 16 may be a semi-insulating substrate made of GaAs or the like. In this case, it is possible to directly form the relay pads 8a to 8e, 9a to 9e and the wiring 10a to 10e on the substrate 16 and eliminate the necessity for the insulating layer 17 that insulates the substrate 16 and the wiring 10a to 10e or the like. Thus, the process of manufacturing the wiring device 5 can be shortened and the manufacturing cost can be reduced. Note that a printed circuit board may be used as the wiring device 5. Use of a low cost printed circuit board can reduce material costs.

It is preferable to adjust the thicknesses of devices through grinding in a semiconductor device manufacturing process and reduce height differences between the pads 13a to 13e and the relay pads 9a to 9e to 100 µm or less. Making pad heights identical makes it possible to shorten the wires 12a to 12e and thereby prevent the fine wires 12a to 12e from being displaced during injection of sealing resin.

Second Embodiment

Figure 6:
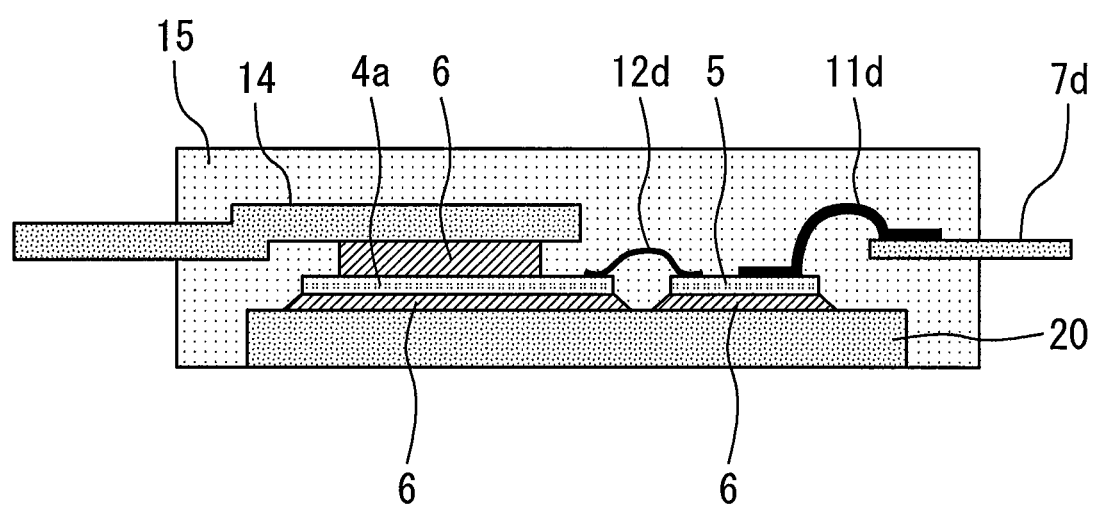
FIG. 6 is a cross-sectional view illustrating a semiconductor module according to a second embodiment.

FIG. 6 is a cross-sectional view illustrating a semiconductor module according to a second embodiment. A conductor plate 20 is used as a base plate in the present embodiment. The semiconductor devices 4a to 4d and the wiring device 5 are provided on the same plane of the conductor plate 20. The conductor plate 20 is a heat spreader made mainly, for example, of copper. The heat spreader is insulated from a cooling casing such as an air cooling fin or a water cooling fin via an insulating sheet or insulating plate bonded to the undersurface. Such insulators and the heat spreader may be directly bonded or bonded via thermal grease or the like.

Using the conductor plate 20, it is possible to efficiently spread heat even in the case of the semiconductor devices 4a to 4d with relatively small effective areas, reduce thermal resistance and improve conduction performance and reliability with respect to semiconductor losses. In the case of the semiconductor devices 4a to 4d made mainly of silicon carbide or the like in particular, it is difficult to increase the areas and heat needs to be spread efficiently, and so the present embodiment is particularly effective.

Since it is difficult to form wiring on the conductor plate 20, conventionally, lead frames or the like are often assigned a role of wiring. This constitutes an impediment to miniaturization of the semiconductor module and wires are short-circuited due to tolerance in formation or assembly of lead frames, resulting in deterioration of manufacturing yield and reliability. By contrast, in the present embodiment, use of the wiring device 5 allows wiring to be provided on the conductor plate 20, and these problems can thus be solved. The rest of the configuration and effects are similar to those of the first embodiment.

REFERENCE SIGNS LIST 1 insulating substrate (base plate); 2 circuit pattern (strong electricity part); 4a-4d semiconductor device; 5 wiring device; 7a-7e external electrode; 8a-8e,9a-9e relay pad; 10a-10e wiring; 11a-11e,12a-12e wire; 13a-13e pad; 14 plate-shaped conductor; 15 resin; 16 substrate; 17 insulating layer; 18 coating film; 19 gate resistor; 20 conductor plate (base plate)

The invention claimed is:

1. A semiconductor module comprising:
a base plate;
a semiconductor device provided on the base plate and having a pad;
an external electrode;
a wiring device provided on the base plate and including a first relay pad, a second relay pad provided closer to the pad than the first relay pad, and wiring connecting the first relay pad and the second relay pad;
a first wire connecting the external electrode and the first relay pad;
a second wire connecting the pad and the second relay pad; and
resin sealing the semiconductor device, the wiring device and the first and second wires,
wherein the second wire is thinner than the first wire, and the pad is smaller than the first relay pad.

2. The semiconductor module according to claim 1, further comprising a strong electricity part provided on the base plate and connected to a power terminal on an undersurface of the semiconductor device,
wherein the wiring device further includes a substrate provided on the strong electricity part, and an insulating layer provided on the substrate, and
the first and second relay pads and the wiring are provided on the insulating layer.

3. The semiconductor module according to claim 1, wherein the base plate is a conductor plate.

4. The semiconductor module according to claim 1, wherein the wiring includes first wiring provided in a ring shape and second wiring provided inside the first wiring.

5. The semiconductor module according to claim 4, wherein part of the ring-shaped first wiring is opened.

6. The semiconductor module according to claim 1, wherein the semiconductor device includes a plurality of transistors,
the second relay pad includes a plurality of pads connected to gates of the plurality of transistors respectively,
a plurality of gate resistors are connected between the plurality of pads and the wiring respectively, and
the higher a threshold voltage of the corresponding semiconductor device is, the lower resistance value of the gate resistor is.

7. The semiconductor module according to claim 6, wherein a main material of the gate resistor is silicon.

8. The semiconductor module according to claim 1, wherein the semiconductor device includes a first semiconductor device including a sense device, and a second semiconductor device including no sense device, and
the first semiconductor device is located inside the base plate compared with the second semiconductor device.

9. The semiconductor module according to claim 1, further comprising a plate-shaped conductor bonded to a surface electrode of the semiconductor device.

10. The semiconductor module according to claim 1, wherein the wiring device includes a coating film covering the wiring.

11. The semiconductor module according to claim 10, wherein a main material of the coating film is polyimide.

12. The semiconductor module according to claim 1, wherein the semiconductor device includes a compound semiconductor substrate.

13. The semiconductor module according to claim 1, wherein the wiring device includes a silicon substrate.

14. The semiconductor module according to claim 1, wherein the wiring device includes a semi-insulating substrate.

15. The semiconductor module according to claim 1, wherein the wiring device is a printed circuit board.

16. The semiconductor module according to claim 1, wherein a main material of the second wire is gold.

17. The semiconductor module according to claim 1, wherein a main material of the first wire is aluminum.

18. The semiconductor module according to claim 1, wherein a height difference between the pad and the second relay pad is 100 μm or less.

* * * * *